(12) United States Patent
Ghyselen et al.

(10) Patent No.: US 12,715,764 B2
(45) Date of Patent: Aug. 25, 2026

(54) METHOD FOR MANUFACTURING A STRUCTURE COMPRISING A PLURALITY OF MEMBRANES OVERHANGING CAVITIES

(71) Applicants: Soitec, Bernin (FR); Commissariat À L'énergie Atomique Et Aux Énergies Alternatives, Paris (FR)

(72) Inventors: Bruno Ghyselen, Bernin (FR); Thierry Salvetat, Grenoble Cedex (FR); Guillaume Berre, Grenoble Cedex (FR); François Rieutord, Grenoble Cedex (FR)

(73) Assignees: Soitec, Bernin (FR); Commissariat À L'énergie Atomique Et Aux Énergies, Paris (FR)

( * ) Notice: Subject to any disclaimer, the term of this patent is extended or adjusted under 35 U.S.C. 154(b) by 467 days.

(21) Appl. No.: 18/348,607

(22) Filed: Jul. 7, 2023

(65) Prior Publication Data

US 2024/0010491 A1 Jan. 11, 2024

(30) Foreign Application Priority Data

Jul. 8, 2022 (FR) ...................................... 2207032

(51) Int. Cl.
*B81C 1/00* (2006.01)
*H10P 90/00* (2026.01)
*H10W 10/10* (2026.01)

(52) U.S. Cl.
CPC ...... *B81C 1/00182* (2013.01); *B81C 1/00047* (2013.01); *H10P 90/1916* (2026.01); *H10W 10/181* (2026.01); *B81C 2201/0194* (2013.01)

(58) Field of Classification Search
CPC ........ B81C 1/00158; B81C 2201/0195; B81C 2201/0192; H01L 21/76254
See application file for complete search history.

(56) References Cited

U.S. PATENT DOCUMENTS 6,191,007 B1 * 2/2001 Matsui .................. H10D 86/01 438/455
6,245,618 B1 * 6/2001 An ........................ H10P 30/204 438/290

(Continued)

FOREIGN PATENT DOCUMENTS

FR 3100081 A1 2/2021

*Primary Examiner* — Mohsen Ahmadi
(74) *Attorney, Agent, or Firm* — TraskBritt

(57) ABSTRACT

A method for manufacturing a structure comprising membranes overhanging cavities, comprises:

a) forming cavities opening at a front face of a support substrate, the cavities having a depth and an area, and being spaced apart by a spacing;
b) assembling, by way of direct bonding, a donor substrate on the support substrate to seal the cavities under vacuum, the direct bonding being hydrophilic and involving a given number of water monolayers at a contact interface between the substrates; and
c) transferring a thin layer from the donor substrate onto the support substrate, the thin layer comprising the membranes.

A specific area is defined around each cavity in the plane of the contact interface and is expressed as a function of half of the spacing. The area, the depth of each cavity, and the specific area are defined in step a) to satisfy a particular relationship.

18 Claims, 2 Drawing Sheets

(56) References Cited

U.S. PATENT DOCUMENTS

| | | | | |
|---|---|---|---|---|
| 6,352,909 | B1 * | 3/2002 | Usenko | H10P 30/204<br>438/459 |
| 6,958,255 | B2 * | 10/2005 | Khuri-Yakub | B81C 1/00158<br>438/118 |
| 8,415,208 | B2 * | 4/2013 | Takayama | H10D 86/0214<br>438/149 |
| 8,461,017 | B2 * | 6/2013 | Sadaka | H10P 90/1914<br>438/455 |
| 2003/0032210 | A1 * | 2/2003 | Takayama | H10D 86/0214<br>438/455 |
| 2004/0195646 | A1 * | 10/2004 | Yeo | H10D 86/201<br>257/527 |
| 2006/0118817 | A1 * | 6/2006 | Haisma | H10P 90/1916<br>428/401 |
| 2007/0200144 | A1 * | 8/2007 | Aspar | B81C 1/00357<br>257/E21.567 |
| 2011/0233719 | A1 * | 9/2011 | Blanchard | H10P 90/1914<br>438/455 |
| 2011/0244655 | A1 * | 10/2011 | Akiyama | H10P 90/1916<br>257/E21.211 |
| 2014/0158041 | A1 * | 6/2014 | Bruel | C30B 19/10<br>118/712 |
| 2019/0202688 | A1 * | 7/2019 | Benaissa | B81C 1/00507 |
| 2022/0051934 | A1 * | 2/2022 | Schwarzenbach | H10P 90/1916 |
| 2023/0369095 | A1 * | 11/2023 | Zinner | H10P 72/0428 |

* cited by examiner 11
100
2a
10
3
2
2b
z
x
y 2a
3
3
e
p
2
L
2b
2a
3
4
e
L
A
A
2

1b
150
1
2a
10
5
1a
3
2
2b

METHOD FOR MANUFACTURING A STRUCTURE COMPRISING A PLURALITY OF MEMBRANES OVERHANGING CAVITIES

PRIORITY CLAIM

This application claims the benefit of the filing date of French Patent Application Serial No. FR2207032, filed Jul. 8, 2022, for "METHOD FOR MANUFACTURING A STRUCTURE COMPRISING A PLURALITY OF MEMBRANES OVERLOOKING CAVITIES."

TECHNICAL FIELD

The present disclosure relates to the field of microelectronics and electromechanical microsystems. In particular, the present disclosure relates to a method for collectively manufacturing a plurality of membranes overhanging and sealing the cavities, within a structure comprising a support substrate and a thin layer (which comprises the membranes), the cavities being confined between the support substrate and a face of the thin layer.

BACKGROUND

MEMS ("microelectromechanical systems") devices are widely used for manufacturing various sensors that target a multitude of applications: mention may be made, for example, of pressure sensors, microphones, radiofrequency switches, electroacoustic and ultrasound transducers (for example, pMUT for "piezoelectric micromachined ultrasonic transducer"), etc. Many of these MEMS devices are based on a flexible membrane overhanging a cavity. In operation, the flexing of the membrane, linked to a physical parameter (for example, the propagation of an acoustic wave for a pMUT), is converted into an electrical signal (or vice versa depending on whether the device is in receiver or transmitter mode).

There are several layer transfer methods that make it possible to obtain a structure comprising a plurality of membranes each overhanging a cavity. They are advantageously based on an assembling, by way of direct bonding (i.e., without adding adhesive material), a donor substrate and a support substrate, at their respective front faces. One or other of the substrates comprises cavities opening on the side of its front face, usually the support substrate. These cavities are sealed during the step of molecular adhesion assembly of the two substrates. A step of thinning the donor substrate gives rise to the transfer of a thin layer onto the support substrate. This thinning step may involve mechanical, chemical or mechanical/chemical thinning of the donor substrate, which may optionally comprise a plurality of buried stop layer(s) to promote obtaining a uniform thin layer.

It can also be based on the Smart Cut™ method, which implements a buried brittle plane, formed by implanting light elements into the donor substrate, which delimits, with a front face of the donor substrate, the thin layer to be transferred. As is well known per se, the growth of microcracks in the buried brittle plane, by thermal and/or mechanical activation, leads to a separation along the plane, which gives rise to the transfer of the thin layer onto the support substrate. The remainder of the donor substrate may be reused for a subsequent layer transfer.

The thinning step can further employ a detachable donor substrate, i.e., comprising the thin layer to be transferred associated with a temporary substrate via an interface or a detachable layer. Mention may be made, in particular, of a roughened bonding interface, a porous layer or another interface/layer allowing disassembly. After assembling, by way of direct bonding, the donor substrate on the support substrate, application of thermal, chemical and/or mechanical stress makes it possible to obtain a separation at the detachable interface or layer, giving rise to the transfer of the thin layer onto the support substrate, the temporary substrate potentially being reused for a subsequent thin layer transfer.

After transfer of the thin layer onto the support substrate, it is usually observed that membranes in line with the cavities have a positive or negative deformation (along an axis normal to the plane of the front face of the support substrate), not identical between the plurality of membranes. The variability of these deformations can make later technological steps required for manufacturing MEMS devices complicated or uneven. It may also generate variable electromechanical behaviors between the membranes of the structure, affecting the performance of the devices or their manufacturing output.

FR3100081 proposes a method for sealing a plurality of cavities by membranes making it possible to reduce the deformation differential of the membranes.

Beyond a reduction in the variability of deformation, it appears to be beneficial to target as low a deformation of the membranes as possible over the entire extent of the structure.

BRIEF SUMMARY

The present disclosure proposes a method for collectively manufacturing a plurality of membranes overhanging and sealing the cavities, within a structure comprising a support substrate and a thin layer (which comprises the membranes), the cavities being delimited between one face of the support substrate and one face of the thin layer, and the membranes having minimal or even zero deformation over the entire extent of the structure.

The present disclosure relates to a method for manufacturing a structure comprising a plurality of membranes, each overhanging a cavity, the manufacturing method comprising the following steps:

a) a step of forming a plurality of cavities opening at a front face of a support substrate, the cavities having a depth and an area in the plane of the front face, and being spaced apart by a spacing;

b) a step of assembling, by way of direct bonding, a donor substrate on the support substrate, at their respective front faces, so as to seal the cavities under vacuum, the direct bonding being hydrophilic and involving a given number of water monolayers at a contact interface between the donor substrate and the support substrate; and c) a step of transferring a thin layer from the donor substrate onto the support substrate, the thin layer comprising the membranes in line with the cavities.

A specific area is around each cavity, in the plane of the contact interface, the specific area being expressed as a function of half of the spacing. The manufacturing method is remarkable in that the area, the depth of each cavity, and the specific area are defined in step a) to satisfy the following relationship: $S/A=(P_{atm}\times p)/(N\times 10^{15}\times k_B\times T)$, where $P_{atm}$ is atmospheric pressure, N is the number of water monolayers at the contact interface, $k_B$ is the Boltzmann constant and T is the ambient temperature.

According to advantageous features of the present disclosure, taken alone or in any feasible combination:

the number of water monolayers is between 1 and 5, more particularly between 1 and 3;

each cavity has a square shape in the plane of the front face of the support substrate, and has a side length, the cavities are distributed in matrix fashion with a constant spacing between them, and the spacing and the length of the cavities are linked by the following relationship: $e/L=\text{root}[1+[(P_{atm}\times p)/(N\times 10^{15}\times k_B\times T)]]-1$;

the support substrate is formed of at least one material selected from silicon, germanium, III-V compound semiconductors, lithium tantalate, lithium niobate and glass;

the thin layer is formed of at least one material selected from silicon, germanium, III-V compound semiconductors, lithium tantalate and lithium niobate;

at least one of the support substrate and the thin layer of the structure comprises a material, along the contact interface, which oxidizes in the presence of water molecules;

the transfer step c) is based on creating a brittle plane buried in the donor substrate prior to the assembly step b), and on applying a heat treatment during step c) to develop microcracks in the buried brittle plane and result in a separation along the plane;

the method comprises a preparatory sequence, prior to step a), in the case where the number of water monolayers involved in the direct bonding of step b) is not known, the preparatory sequence comprising:

forming a plurality of cavities opening at a front face of a test support substrate, the cavities having depth and lateral dimensions, and being spaced apart by a test spacing;

assembling, by way of direct bonding, a donor substrate on the test support substrate, at their respective front faces, so as to seal the cavities under vacuum, the direct bonding being hydrophilic and involving a given number of water monolayers at a contact interface between the donor substrate and the test support substrate;

transferring a thin layer from the donor substrate onto the test support substrate to form a test structure;

measuring an average deformation, along an axis normal to the plane of the front face of the test support substrate, of a plurality of membranes of the test structure;

determining the spacing between the cavities to be applied in step a) as a function of the test spacing, of the lateral dimensions of the cavities, of the average deformation of the membranes, of the depth of the cavities, and of the thickness of the thin layer.

BRIEF DESCRIPTION OF THE DRAWINGS

Other features and advantages of the present disclosure will emerge from the following detailed description of embodiments of the present disclosure with reference to the appended figures, in which.

Certain figures are schematic depictions that, for the sake of readability, are not to scale. In particular, the thicknesses of the layers along the z axis are not to scale with respect to the lateral dimensions along the x and y axes.

The same references in the figures may be used for elements of the same type.

DETAILED DESCRIPTION

Figures 1, 2A, 2B:
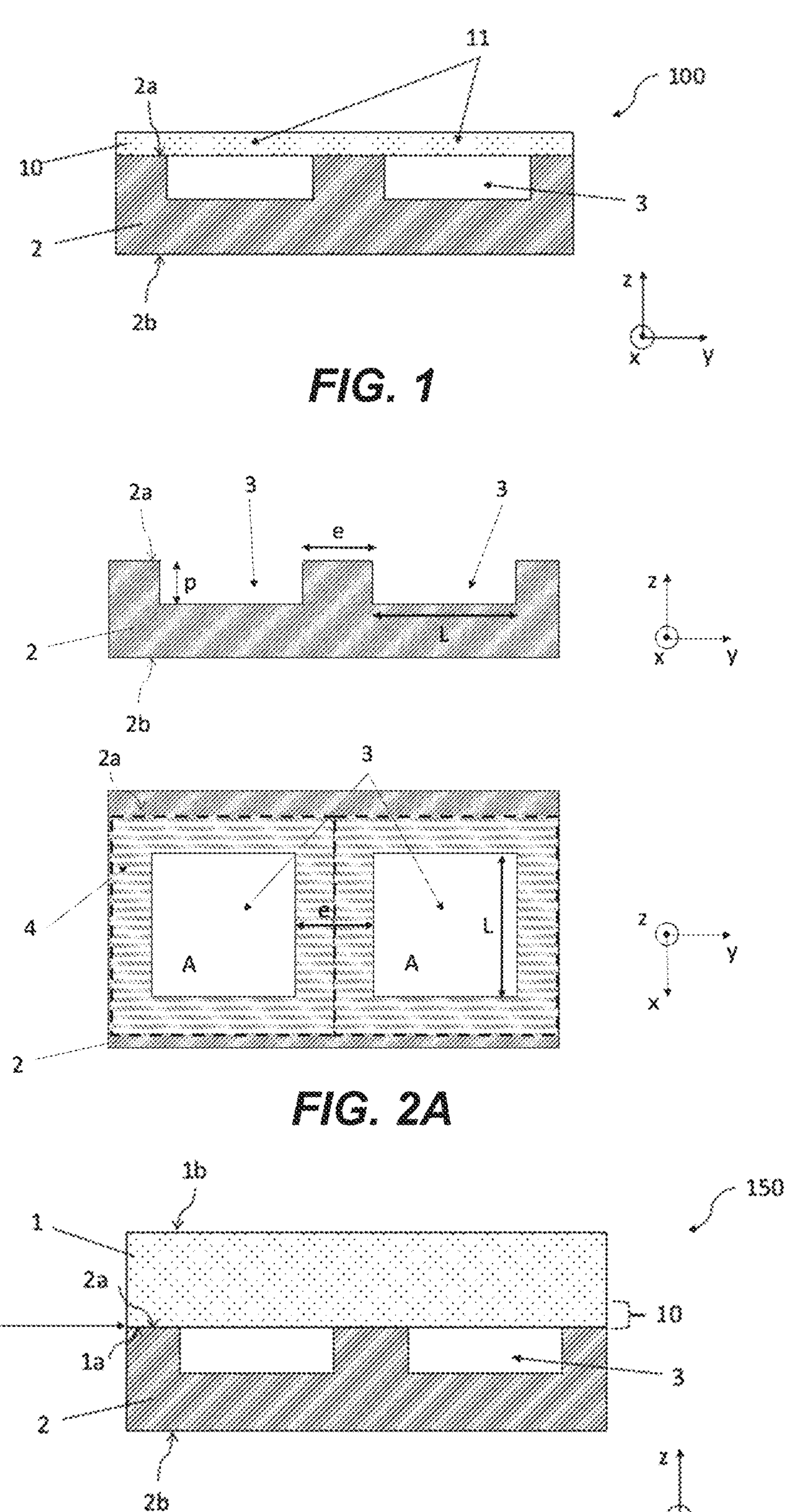
FIG. 1 shows a structure developed according to the manufacturing method according to the present disclosure.
FIGS. 2A-2C show steps of the manufacturing method according to the present disclosure with FIG. 2A illustrating a sectional view and a top view.

The present disclosure relates to a method for manufacturing a structure 100 comprising a plurality of membranes 11, each overhanging a cavity 3 (FIG. 1).

The manufacturing method first comprises a step a) of forming a plurality of cavities 3 opening at a front face 2*a* of a support substrate 2 (FIG. 2A).

The support substrate 2 advantageously has the form of a disc, with a diameter greater than 100 mm, for example, 150 mm, 200 mm or 300 mm, and has a front face 2*a* and a rear face 2*b*. The thickness of the support substrate 2 is typically between 200 and 900 microns. The support substrate 2 may be formed of at least one material selected from silicon, germanium, III-V compound semiconductors, lithium tantalate, lithium niobate, glass, or other material of interest for the intended application.

As is well known per se, there are different methods for forming cavities 3 on the surface of a substrate. These methods may, in particular, involve lithography techniques (to define the distribution and shape of the cavities 3 in the plane (x, y) of the front face 2*a*) and etching techniques (to locally etch the support substrate 2 in the zones defined for the cavities 3, over a given depth).

Each cavity 3 has a depth p that can typically vary between 100 nm and 100 μm. The shape of each cavity 3, in the plane (x, y) of the front face 2*a*, may be circular, square, rectangular or polygonal. The characteristic dimension(s) (or lateral dimension(s)) of a cavity 3 in the plane (x, y), namely its diameter (for a circular shape) or its side L (for a square shape) or its width and length (for a rectangular shape), is typically between 1 μm and 500 μm. The area A (in the plane (x, y)) of a cavity 3 is therefore typically between 1 $\mu m^2$ and 0.25 $mm^2$.

The cavities 3 are spaced apart from one another by a spacing denoted e. This spacing may be between 1 μm and a few hundred mm, for example, 500 μm. Even if this is not shown in the figures, the cavities 3 could be separated by a different spacing along the x axis and along the y axis.

A contour region 4 is defined around each cavity 3, in the plane (x, y) of the front face 2*a* of the support substrate 2 (regions delimited by dotted lines in FIG. 2A). Each contour region 4 surrounds a cavity 3 and is adjacent but unattached to the contour regions 4 surrounding the neighboring cavities 3. The set of contour regions 4 corresponds to the surface free of cavities 3 of the front face 2*a* of the support substrate 2.

The area of a contour region 4 is called the specific area S. is the specific area S is expressed as a function of half of the spacing e between neighboring cavities 3. In the example of FIG. 2A (square cavities 3), the specific surface area is expressed as a function of the spacing e between the cavities 3 and of the length L on the side of the cavities 3 as follows:

$$S=e^2+(2L\times e) \quad \text{[Equ.1]}$$

This specific area S may be, of course, expressed differently depending on the shape of the cavities 3 and their distribution. In any case, the specific area S can be expressed as a function of half of the spacing e and the lateral dimensions of the cavity 3.

The front face 2*a* of the support substrate 2 is intended to be assembled against a front face 1*a* of a donor substrate 1.

Like the support substrate 2, the donor substrate 1 advantageously has the form of a disc, with a diameter greater than 100 mm, for example, 150 mm, 200 mm or 300 mm, and has a front face 1*a* and a rear face 1*b*. The donor substrate 1 has a thickness typically between 200 and 900 microns. The donor substrate 1 may be formed of at least one material selected from silicon, germanium, III-V compound semiconductors, lithium tantalate, lithium niobate, or other material of interest to form the membranes 11 in line with the cavities 3. Indeed, the donor substrate 1 is intended to provide a thin layer 10, which, transferred onto the support substrate 2, will form the plurality of membranes 11 overhanging the cavities 3.

The manufacturing method according to the present disclosure then comprises a step b) of assembling, by way of direct bonding, the donor substrate 1 on the support substrate 2, at their respective front faces 1*a*, 2*a*, so as to seal the cavities 3 and to form a bonded structure 150 (FIG. 2B).

The principle of direct bonding, well known in the prior art, will not be described in more detail here. Because it is based on molecular adhesion between assembled faces, a very good surface condition (clean, low roughness, etc.) of the substrates 1, 2 is required to obtain good assembly quality.

Prior to assembly, preparation of the donor substrate 1 and support substrate 2 is usually carried out. By way of example, a conventional sequence used in microelectronics, in particular for silicon-based substrates, comprises ozone cleaning, SC1 ("Standard Clean 1") cleaning and SC2 ("Standard Clean 2") cleaning, with interspersed rinses. Activation of the surfaces to be assembled, for example, by plasma, may also be carried out before contacting in order to promote a strong bonding energy between the surfaces.

Optionally, the donor substrate 1 and/or the support substrate 2 may comprise an intermediate layer, at their front faces 1*a*, 2*a*, respectively, to promote the bonding quality and the bonding energy of their interface. This intermediate layer may in particular be formed from silicon oxide. In the particular case where the donor substrate 1 and the support substrate 2 are made of silicon, the structure 100 obtained at the end of the method is an SOI (silicon-on-insulator) structure with buried cavities 3.

The direct bonding of step b) is carried out in a low-pressure chamber, so as to seal the cavities 3 under vacuum, typically with a pressure of less than 1 mbar. Advantageously, the pressure in the cavities 3 is on the order of $5\cdot10^{-3}$ mbar.

Furthermore, the direct bonding of step b) is of the hydrophilic type, i.e., it involves a given number (N) of water monolayers at a contact interface 5 between the donor substrate 1 and the support substrate 2. Depending on the surface preparations before assembly, materials brought into contact (materials making up the donor substrate 1 and the support substrate 2) as well as the bonding atmosphere, the number of water monolayers at the contact interface 5 can vary, typically between 1 and 5.

By way of example, in the case of a support substrate 2 made of silicon assembled on a silicon donor substrate 1 provided on its front face 1*a* with an intermediate layer made of silicon oxide, by way of direct hydrophilic bonding, in an enclosure at $5\cdot10^{-3}$ mbar, the number of water monolayers at the contact interface 5 is between 1 and 3.

It should be noted that the number of water monolayers on the surface of the substrates 1, 2 can be evaluated by X-ray reflection, for example, in an ESRF type facility.

As mentioned above, the set of contour regions 4 corresponds to the surface free of cavities 3 of the front face 2*a* of the support substrate 2. All of the contour regions 4 are therefore assembled with the front face 1*a* of the donor substrate 1 to form the contact interface 5 of the bonded structure 150.

Figures 2C, 3, 4:
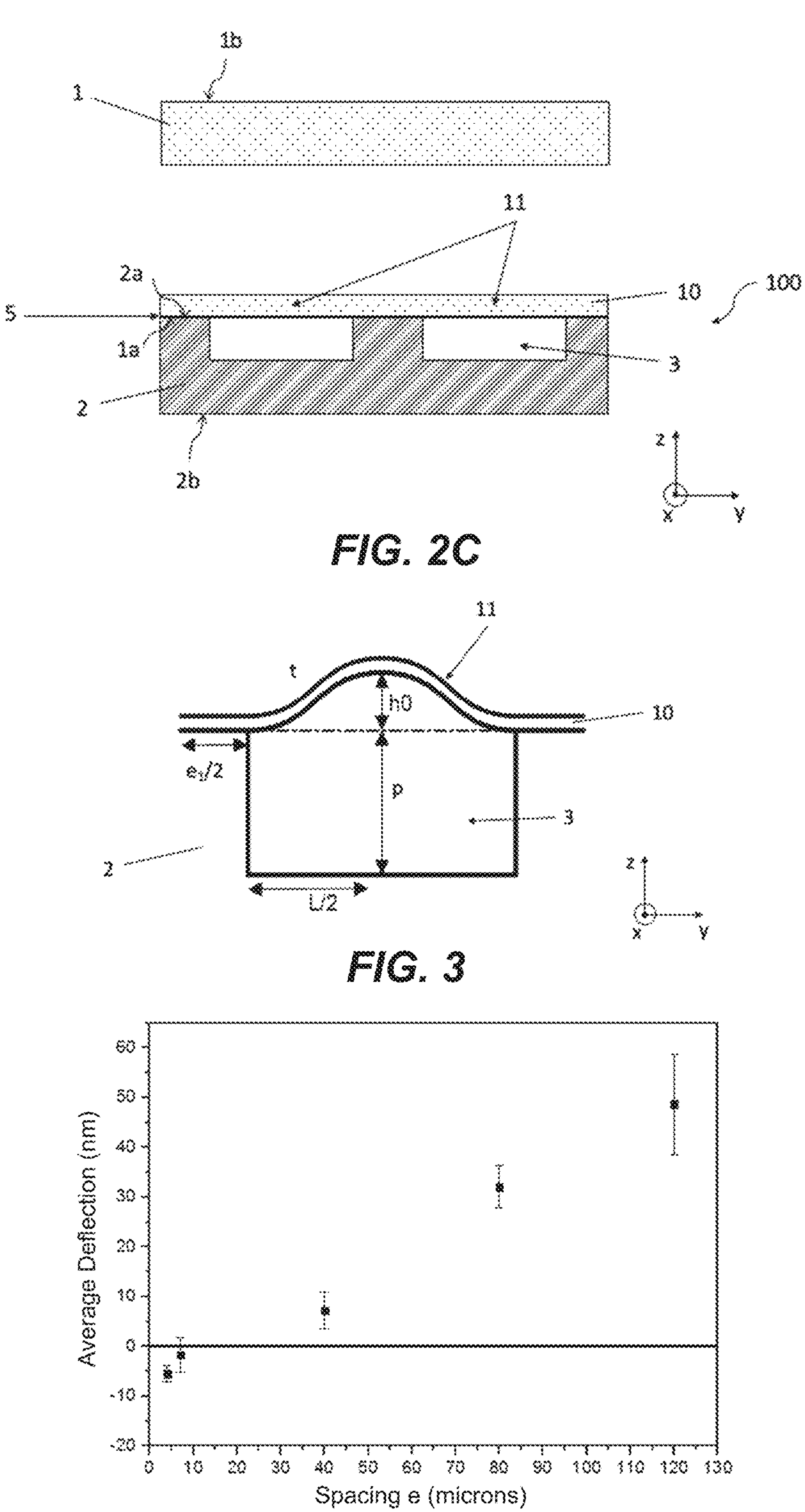
FIG. 3 shows a diagram of a membrane deformed above a cavity in a test structure produced in the manufacturing method according to the present disclosure.
FIG. 4 shows a graph correlating the spacing between the cavities and the average deflection obtained, for square cavities with lateral dimensions (25 μm) and a fixed depth (350 nm), developed under similar conditions of adhesive bonding (under vacuum at a pressure of $5\cdot 10^{-3}$ mbar), with a silicon membrane with a thickness of 1.4 μm.

The manufacturing method according to the present disclosure finally comprises a step c) of transferring a thin layer 10 from the donor substrate 1 onto the support substrate 2. The thin layer 10 comprises the membranes in line with the cavities (FIG. 2C).

The transfer step c) can be carried out by any known thin layer (10) transfer technique.

Preferably, the transfer step c) is based on creating a buried brittle plane in the donor substrate 1 prior to the assembly step b). Such a buried brittle plane is typically formed by implanting light elements (in particular hydrogen and/or helium, or other elements), which induce microcavity type defects (also called "platelets" due to their usually lenticular shape), in particular near the peak of maximum concentration. This buried region of microcavities is referred to as a buried brittle plane for simplicity's sake. Step c) then comprises the application of a heat treatment to grow the microcavities and develop microcracks in the buried brittle plane so as to result in a separation along the buried brittle plane. This technique is known as the Smart Cut™ method, which is well known for the transfer of a single-crystal thin layer from a donor substrate 1 onto a support substrate 2, and will not be described in more detail herein.

It should be noted that finishing and/or smoothing (mechanical, mechanical/chemical, chemical or thermal) steps of the free surface of the thin layer 10 after transfer can be carried out to achieve the crystalline quality and the surface area required for the thin layer 10.

The present disclosure applies to the cases where at least one of the donor substrate 1 and support substrate 2 comprises a material, at the contact interface 5, which oxidizes in the presence of water molecules ($H_2O$). Thus, during the different thermal treatment(s) applied to the bonded structure 150, either to reinforce the bonding energy of the contact interface 5, or to perform step c) or in an even later step of the method, an oxidation reaction of the material takes place and results in the formation of gaseous dihydrogen molecules.

In the particular example of a contact interface 5 comprising silicon, the oxidation reaction is written as follows: $Si+2H_2O\rightarrow SiO_2+2H_2$.

It has been demonstrated that the gas $H_2$ is produced at the contact interface 5 and is capable of diffusing and filling the cavities 3. The presence of this gas therefore causes a rise in pressure in the volume of the sealed cavity 3, likely to induce a deformation of the membrane 11 when the latter is formed and will undergo atmospheric pressure $P_{atm}$ on its upper face.

As an example, the graph of FIG. 4 shows the change of the average deflection of the membrane 11, as a function of the spacing e between square cavities 3 each 25 μm on a side, with a membrane thickness (silicon) of 1.4 μm, and under given bonding conditions. It can be seen experimentally that there is a spacing condition for which the deformation of the membrane is zero, or at least greatly reduced.

The present disclosure precisely aims to minimize this deformation by establishing design rules that restrict the bonding conditions, the dimensions of the cavities 3 and their distribution on the support substrate 2.

For this, the area A, the depth p of each cavity 3, and the specific area S of the contour regions 4 are defined in step a) of the method, to satisfy the following relationship:

$$\frac{S}{A} = \frac{P_{atm} \times p}{N \times 10^{15} \times k_B \times T} \quad \text{[Equ. 2]}$$

where $P_{atm}$ is atmospheric pressure ($10^5$ Pa), p is the depth of each cavity, N is the number of water monolayers at the contact interface 5, $k_B$ is the Boltzmann constant ($1.38 \cdot 10^{-23}$ J/K) and T is the ambient temperature (300K).

The step b) of assembling by way of direct bonding defines the number N of water monolayers that will be present at the contact interface 5. It has been established that the estimated quantity $n_{H2}$ of gas molecules $H_2$ produced at the contact interface 5 and diffusing in each cavity 3 is linked to the specific area S and to the number of N monolayers according to the following relationship:

$$n_{H2} = S \times N \times 10^{15} \quad \text{[Equ.3]}$$

By injecting this relationship Equ.3 into the ideal gas law, the aforementioned relationship Equ.2 is obtained, which defines the design rules that restrict the conditions of bonding, dimensions and distribution of the cavities 3. In other words, the area A (lateral dimensions), the depth p of the cavities 3 and the spacing e between the cavities 3 can be defined from the relation Equ.2 so as to minimize the deformation of the membrane 11 at the end of the method of step c).

In the particular case of square-shaped cavities 3 (in the plane (x, y) of the front face 2*a* of the support substrate 2), having a length of side L and distributed in matrix fashion with a constant spacing e between them, the following relationship can be established:

$$\frac{e}{L} = \sqrt{1 + \frac{P_{atm} \times p}{N \times 10^{15} \times k_B \times T}} - 1 \quad \text{[Equ. 4]}$$

where $P_{atm}$ is atmospheric pressure, p is the depth of each cavity 3, N is the number of water monolayers at the contact interface 5, $k_B$ is the Boltzmann constant and T is the ambient temperature.

This equation can make it possible to prepare charts connecting the spacing e and the length of side L for square cavities having different depths p and for a number of water monolayers that can vary between 1 and 5. These charts give design rules, for given bonding conditions, making it possible to minimize the deflection of the membrane 11 in line with the cavities 3.

According to one variant, the manufacturing method comprises a preparatory sequence, prior to step a), applied in the case where the number n of water monolayers involved in the direct bonding of step b) is not known.

The preparatory sequence first comprises forming a plurality of cavities opening at a front face of a test support substrate. These cavities have a depth p and lateral dimensions (length of side L, in the case of square cavities), and are spaced apart by a test spacing e1.

The preparatory sequence further comprises assembling, by way of direct bonding, a donor substrate 1 on the test support substrate, at their respective front faces, so as to seal the cavities under vacuum, the direct bonding being hydrophilic and involving a given number of water monolayers at the contact interface between the donor substrate 1 and the test support substrate.

Next, a thin layer 10 is transferred from the donor substrate 1 onto the test support substrate to form a test structure.

The preparatory sequence then provides for the measurement of an average deformation $h_0$, along an axis z normal to the plane (x, y) of the front face of the test support substrate, of a plurality of membranes 11 of the test structure (FIG. 3). From these measurements, the pressure difference between the interior and exterior of the cavity 3 is determined, which makes it possible to raise the quantity of gas $H_2$ produced, under the bonding conditions used.

Considering that the membrane 11 is embedded on the edges of the cavity 3, the relationship between the maximum deflection $h_0$, and the pressure difference ΔP and the lateral dimension L of the membrane 11 is written:

$$h_0 = \frac{3}{64}\left(1 - v^2\right)\frac{\Delta P}{E}\frac{L^4}{t^3} \quad \text{[Equ. 5]}$$

where t is the thickness of the membrane 11 (and of the thin layer 10), and E and v, respectively, are the Young's modulus and the Poisson's ratio of the thin layer 10.

The relationship Equ.5 can also be written as:

$$\Delta P = E\frac{64}{3\left(1 - v^2\right)}\frac{t^3 h_0}{L^4} \quad \text{[Equ. 5']}$$

By neglecting the change in volume associated with the deformation of the membrane 11, the following relationship can be written between the quantity $n^1_{H2}$ of gas in the cavity and the pressure in the form:

$$(P_{atm} + \Delta P) \times A \times p = n'_{H2} \times k_B \times T = N \times 10^5 \times (e_1^2 + 2L \cdot e_1) \times k_B \times T \quad \text{[Equ.6]}$$

where A is the area of the cavity, L is its lateral dimension, p is its depth, and e1 is the test spacing between the cavities.

This same expression, for an undeformed membrane 11, with a spacing e between the cavities 3, gives:

$$(P_{atm}) \times A \times p = n_{H2} \times k_B \times T = N \times 10^{15} \times (e^2 + 2L \cdot e) \times k_B \times T \quad \text{[Equ.7]}$$

The ratio between the two expressions Equ.7 and Equ.6 leads to establishing an intermediate relationship Equ.8', resulting in a relationship Equ.8 between the targeted spacing e to minimize the deformation of the membranes 11, under the adhesive bonding conditions tested, with the dimensions (L, p) of the cavities 3 also tested and the characteristics of the transferred thin layer 10:

$$\frac{e^2 + 2L \cdot e}{e_1^2 + 2L \cdot e_1} = \frac{P_{atm}}{(P_{atm} + \Delta P)} = \frac{1}{1 + \frac{E}{P_{atm}}\frac{64}{3\left(1 - v^2\right)}\frac{t^3 h_0}{L^4}} \quad \text{[Equ. 8']}$$

-continued $$e = L \times \left( -1 + \sqrt{1 + \frac{1}{1 + \frac{E}{P_{atm}} \frac{64}{3(1-\nu^2)} \frac{t^3 h_0}{L^4}} \times \left( \frac{e_1^2}{L^2} + \frac{2e_1}{L} \right)} \right) \quad \text{[Equ. 8]}$$

The preparatory sequence therefore makes it possible to identify the spacing e between the cavities 3 to be applied in step a), which will allow a minimum deformation of the membranes 11 after transfer, under the bonding conditions and with the physical characteristics (thickness and nature of the thin layer 10) and dimensional characteristics (lateral size and depth of the cavities) tested.

The preparatory sequence has been described in the case of square-shaped cavities. The relationships Equ.5 to Equ.8 could be, of course, adapted to take into account a different shape, which would in particular result in an adjusted expression of the area a of the cavities and of the specific area S of the contour regions 4.

The present disclosure can be used for a wide range of MEMS or NEMS ("nanoelectromechanical systems") devices, or for any other application requiring membranes suspended at very low deflection.

Of course, the present disclosure is not limited to the embodiments described and it is possible to add alternative embodiments thereto without departing from the scope of the invention as defined by the claims.

The invention claimed is:

1. A method for manufacturing a structure comprising a plurality of membranes each overhanging a cavity, the manufacturing method comprising the following steps:

a) a step of forming cavities opening at a front face of a support substrate, the cavities having a depth (p) and an area (A) in a plane of the front face, and being spaced apart by a spacing (e);

b) a step of assembling, by way of direct bonding, a donor substrate on the support substrate, at their respective front faces, so as to seal the cavities under vacuum, the direct bonding being hydrophilic and involving a given number (N) of water monolayers at a contact interface between the donor substrate and the support substrate; and c) a step of transferring a thin layer from the donor substrate onto the support substrate, the thin layer comprising the membranes in line with the cavities;

wherein:

a specific area(S) is defined around each of the cavities, in a plane of the contact interface, the specific area(S) being expressed as a function of half of the spacing; and the area (A), the depth (p) of each of the cavities, and the specific area(S) are defined in step a) to satisfy the following relationship: $S/A=(P_{atm}\times p)/(N\times 10^{15}\times k_B\times T)$, where $P_{atm}$ is atmospheric pressure, N is the number of water monolayers at the contact interface, kb is the Boltzmann constant and T is the ambient temperature.

2. The method of claim 1, wherein the number (N) of water monolayers is between 1 and 5.

3. The method of claim 2, wherein:

each cavity of the cavities has a square shape in the plane of the front face of the support substrate, having a side length (L), and the cavities are distributed in matrix fashion with a constant spacing (e) between the cavities; and the spacing (e) and the length (L) of the cavities are linked by the following relationship: $e/L=\text{root}[1+[(P_{atm}\times p)/(N\times 10^{15}\times k_B\times T)]]-1$.

4. The method of claim 3, wherein:

the support substrate comprises at least one material selected from silicon, germanium, III-V compound semiconductors, lithium tantalate, lithium niobate or glass;

the thin layer comprises at least one material selected from silicon, germanium, III-V compound semiconductors, lithium tantalate or lithium niobate; and at least one of the support substrate and the thin layer of the structure comprises a material, along the contact interface, which oxidizes in the presence of water molecules.

5. The method of claim 4, wherein the transfer step c) includes:

creating a buried brittle plane in the donor substrate prior to the assembly step b); and applying a heat treatment during step c) to develop microcracks in the buried brittle plane and result in a separation along the buried brittle plane.

6. The method of claim 5, further comprising a preparatory sequence, prior to step a), wherein the given number (N) of water monolayers involved in the direct bonding of step b) is not known, the preparatory sequence comprising:

forming cavities opening at a front face of a test support substrate, the cavities having the depth (p) and lateral dimensions (L), and being spaced apart by a test spacing (e1);

assembling, by way of direct bonding, a donor substrate on the test support substrate, at their respective front faces, so as to seal the cavities under vacuum, the direct bonding being hydrophilic and involving a given number (N) of water monolayers at a contact interface between the donor substrate and the test support substrate;

transferring a thin layer from the donor substrate onto the test support substrate to form a test structure;

measuring an average deformation ($h_0$), along an axis normal to the plane of the front face of the test support substrate, of a plurality of membranes of the test structure; and determining the spacing (e) between the cavities to be applied in step a) as a function of the test spacing (e1), of the lateral dimensions (L) of the cavities, of the average deformation ($h_0$) of the membranes, of the depth (p) of the cavities and of the thickness of the thin layer.

7. The method of claim 2, wherein the number (N) of water monolayers is between 1 and 3.

8. The method of claim 1, wherein:

each of the cavities has a square shape in the plane of the front face of the support substrate, having a side length (L), and the cavities are distributed in matrix fashion with a constant spacing (e) between the cavities; and the spacing (e) and the length (L) of the cavities are linked by the following relationship: $e/L=\text{root}[1+[(P_{atm}\times p)/(N\times 10^{15}\times k_B\times T)]]-1$.

9. The method of claim 1, wherein:

the support substrate comprises at least one material selected from silicon, germanium, III-V compound semiconductors, lithium tantalate, lithium niobate or glass;

the thin layer comprises at least one material selected from silicon, germanium, III-V compound semiconductors, lithium tantalate or lithium niobate; and at least one of the support substrate and the thin layer of the structure comprises a material, along the contact interface, which oxidizes in the presence of water molecules.

10. The method of claim 1, wherein the transfer step c) includes:

creating a buried brittle plane in the donor substrate prior to the assembly step b); and applying a heat treatment during step c) to develop microcracks in the buried brittle plane and result in a separation along the buried brittle plane.

11. The method of claim 1, further comprising a preparatory sequence, prior to step a), wherein the given number (N) of water monolayers involved in the direct bonding of step b) is not known, the preparatory sequence comprising:

forming cavities opening at a front face of a test support substrate, the cavities having the depth (p) and lateral dimensions (L), and being spaced apart by a test spacing (e1);

assembling, by way of direct bonding, a donor substrate on the test support substrate, at their respective front faces, so as to seal the cavities under vacuum, the direct bonding being hydrophilic and involving a given number (N) of water monolayers at a contact interface between the donor substrate and the test support substrate;

transferring a thin layer from the donor substrate onto the test support substrate to form a test structure;

measuring an average deformation ($h_0$), along an axis normal to the plane of the front face of the test support substrate, of a plurality of membranes of the test structure; and determining the spacing (e) between the cavities to be applied in step a) as a function of the test spacing (e1), of the lateral dimensions (L) of the cavities, of the average deformation ($h_0$) of the membranes, of the depth (p) of the cavities and of the thickness of the thin layer.

12. A method for manufacturing a structure comprising a plurality of membranes each overhanging a cavity, the manufacturing method comprising:

forming cavities each opening at a front face of a support substrate, the cavities having a depth (p) and an area (A) in a plane of the front face, and being spaced apart by a spacing (e);

directly bonding a front face of a donor substrate to a front face of the support substrate and sealing the cavities under vacuum, the direct bonding being hydrophilic and involving a given number (N) of water monolayers at a contact interface between the donor substrate and the support substrate; and transferring a thin layer from the donor substrate onto the support substrate, the thin layer comprising the membranes in line with the cavities;

wherein:

a specific area(S) is defined around each cavity of the cavities, in a plane of the contact interface, the specific area(S) being expressed as a function of half of the spacing; and the area (A), the depth (p) of each of the cavities, and the specific area(S) are defined when forming the cavities to satisfy the following relationship: $S/A=(P_{atm}\times p)/(N\times 10^{15}\times k_B\times T)$, where $P_{atm}$ is atmospheric pressure, N is the number of water monolayers at the contact interface, $k_b$ is the Boltzmann constant and T is the ambient temperature.

13. The method of claim 12, wherein the number (N) of water monolayers is between 1 and 5.

14. The method of claim 13, wherein the number (N) of water monolayers is between 1 and 3.

15. The method of claim 12, wherein:

each of the cavities has a square shape in the plane of the front face of the support substrate, having a side length (L), and the cavities are distributed in matrix fashion with a constant spacing (e) between the cavities; and the spacing (e) and the length (L) of the cavities are linked by the following relationship: $e/L=\text{root}[1+[(P_{atm}\times p)/(N\times 10^{15}\times k_B\times T)]]-1$.

16. The method of claim 12, wherein:

the support substrate comprises at least one material selected from silicon, germanium, III-V compound semiconductors, lithium tantalate, lithium niobate or glass;

the thin layer comprises at least one material selected from silicon, germanium, III-V compound semiconductors, lithium tantalate or lithium niobate; and at least one of the support substrate and the thin layer of the structure comprises a material, along the contact interface, which oxidizes in the presence of water molecules.

17. The method of claim 12, wherein the transferring includes:

creating a buried brittle plane in the donor substrate prior to directly bonding the donor substrate to the support substrate; and applying a heat treatment while transferring the thin layer to develop microcracks in the buried brittle plane and result in a separation along the buried brittle plane.

18. The method of claim 12, further comprising a preparatory sequence, prior to the forming of the cavities, wherein the given number (N) of water monolayers involved in the direct bonding is not known, the preparatory sequence comprising:

forming cavities opening at a front face of a test support substrate, the cavities having the depth (p) and lateral dimensions (L), and being spaced apart by a test spacing (e1);

directly bonding a front face of a donor substrate to a front face of the test support substrate and sealing the cavities under vacuum, the direct bonding being hydrophilic and involving a given number (N) of water monolayers at a contact interface between the donor substrate and the test support substrate;

transferring a thin layer from the donor substrate onto the test support substrate to form a test structure;

measuring an average deformation ($h_0$), along an axis normal to the plane of the front face of the test support substrate, of a plurality of membranes of the test structure; and determining the spacing (e) between the cavities to be applied in the forming of the cavities as a function of the test spacing (e1), of the lateral dimensions (L) of the cavities, of the average deformation ($h_0$) of the membranes, of the depth (p) of the cavities and of the thickness of the thin layer.

* * * * *